(12) United States Patent
Wang et al.

(10) Patent No.: US 7,132,968 B2
(45) Date of Patent: Nov. 7, 2006

(54) HARDWARE-EFFICIENT IMPLEMENTATION OF DYNAMIC ELEMENT MATCHING IN SIGMA-DELTA DAC'S

(75) Inventors: Minsheng Wang, Irvine, CA (US); Anil Tammineedi, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/028,568

(22) Filed: Jan. 5, 2005

(65) Prior Publication Data

US 2005/0134492 A1 Jun. 23, 2005

Related U.S. Application Data

(63) Continuation of application No. 10/812,975, filed on Mar. 31, 2004, now Pat. No. 6,842,130, which is a continuation of application No. 10/354,159, filed on Jan. 30, 2003, now Pat. No. 6,795,003.

(51) Int. Cl.
*H03M 3/00* (2006.01)
(52) U.S. Cl. ...................................... 341/143; 341/144
(58) Field of Classification Search ......... 341/143–144
See application file for complete search history.

(56) References Cited

U.S. PATENT DOCUMENTS

| | | | |
|---|---|---|---|
| 5,056,087 A | 10/1991 | Ferguson | 370/540 |
| 5,305,004 A | 4/1994 | Fattaruso | 341/120 |
| 5,404,142 A * | 4/1995 | Adams et al. | 341/144 |
| 6,124,813 A | 9/2000 | Robertson et al. | 341/143 |
| 6,304,196 B1 * | 10/2001 | Copeland et al. | 341/58 |
| 6,466,153 B1 | 10/2002 | Yu | 341/161 |
| 6,570,521 B1 | 5/2003 | Schofield | 341/144 |
| 6,577,261 B1 | 6/2003 | Ho et al. | 341/144 |
| 6,614,377 B1 * | 9/2003 | Adams et al. | 341/144 |
| 6,720,897 B1 | 4/2004 | Wang | 341/143 |
| 6,762,702 B1 | 7/2004 | Kwan | 341/143 |

OTHER PUBLICATIONS

Adams, R. et al., "A 113-dB SNR Oversampling DAC with Segmented Noise-Shaped Scrambling," *IEEE Journal of Solid-State Circuits* 33:12:1879-1886 (Dec. 1998).

Annovazzi, M. et al., "A Low-Power 98-dB Multibit Audio DAC in a Standard 3.3-V 0.35-μm CMOS Technology," *IEEE Journal of Solid-State Circuits* 37:7:825-834 (Jul. 2002).

Baird, R. and Fiez, T., "Improved ΔΣ DAC Linearity Using Data Weighted Averaging," *IEEE*, pp. 13-16 (1995), unknown month.

(Continued)

*Primary Examiner*—Rexford Barnie
*Assistant Examiner*—Khai Nguyen
(74) *Attorney, Agent, or Firm*—Sterne, Kessler, Goldstein & Fox, P.L.L.C.

(57) ABSTRACT

A data shuffler apparatus for shuffling input bits includes a plurality of bit shufflers each inputting corresponding two bits $x_0$ and $x_1$ of the input bits and outputting a vector $\{x_0', x_1'\}$ such that a number of 1's at bit $x_0'$ over time is within $\forall 1$ of a number of 1's at bit $x_1'$. At least two 4-bit vector shufflers input the vectors $\{x_0', x_1'\}$, and output 4-bit vectors, each 4-bit vector corresponding to a combination of corresponding two vectors $\{x_0', x_1'\}$ produced by the bit shufflers, such that the 4-bit vector shufflers operate on the vectors $\{x_0', x_1'\}$ in the same manner as the bit shufflers operate on the bits $x_0$ and $x_1$. The current state of the bit shufflers is updated based on a next state of the 4-bit vector shufflers.

20 Claims, 11 Drawing Sheets

OTHER PUBLICATIONS

Chen, F. and Leung, B., "Some Observations on Tone Behavior in Data Weighted Averaging," *Proceedings of the IEEE 1998 International Symposium on Circuits and System*, 1-500 through 1-503 (May 31-Jun. 3, 1998).

Chen, K. and Kuo, T., "An Improved Technique for Reducing Baseband Tones in Sigma-Delta Modulators Employing Data Weighted Averaging Algorithm Without Adding Dither," *IEEE Transactions on Circuits and Systems- II: Analog and Digital Signal Processing* 46:1:63-68 (Jan. 1999).

Fishov, A. et al., "Segmented Mismatch-Shaping D/A Conversion," *IEEE*, pp. IV-679 through IV-682 (2002), unknown month.

Folgeman, E. and Galton, I., "A Digital Common-Mode Rejection Technique for Differential Analog-to-Digital Conversion," *IEEE Transactions on Circuits and Systems-II: Analog and Digital Signal Processing* 48:3:255-271 (Mar. 2001).

Galton, I., "Spectral Shaping of Circuit Errors in Digital-to-Analog Converters," *IEEE Transactions on Circuits and System-II: Analog and Digital Signal Processing* 44:10:808-817 (Oct. 1997).

Grilo, J. et al., "A 12-mW ADC Delta-Sigma Modulator With 80dB of Dynamic Range Integrated in a Single-Chip Bluetooth Transceiver," *IEEE Journal of Solid-State Circuits* 37:3:271-278 (Mar. 2002).

Jensen, H. and Galton, I., "A Low-Complexity Dynamic Element Matching DAC for Direct Digital Synthesis," *IEEE Transactions on Circuits and Systems- II: Analog and Digital Signal Processing*, 45:1:13-27 (Jan. 1998).

Kwan, T. et al., "A Stereo Multibit ΣΔ DAC with Asynchronous Master-Clock Interface," *IEEE Journal of Solid-State Circuits* 31:12:1881-1887 (Dec. 1996).

Norsworthy, S.R. et al., eds., "Practical Measures for Preventing Idle Tones" in *Delta-Sigma Data Converters: Theory, Design and Simulation, IEEE Press*, pp. 185-186 (1997).

Radke, R. et al., "A Spurious-Free Delta-Sigma DAC Using Rotated Data Weighted Averaging," *Proceedings of the IEEE 1999 Custom Integrated Circuits Conference*, pp. 125-128 (May 16-19, 1999).

Radke, R. et al., "A 14-Bit Current-Mode ΣΔ DAC Based Upon Rotated Data Weighted Averaging," *IEEE Journal of Solid-State Circuits* 35:8:1074-1084 (Aug. 2000).

Vadipour, M., "Techniques for Preventing Tonal Behavior of Data Weighted Averaging Algorithm in Σ-Δ Modulators," *IEEE Transactions on Circuits and Systems- II: Analog and Digital Signal Processing, Transactions on Circuits and Systems- II: Analog and Digital Signal Processing* 47:11:1137-1144 (Nov. 2000).

Welz, J. et al., "Simplified Logic for First-Order and Second-Order Mismatch-Shaping Digital-to-Analog Converters," *IEEE Transactions on Circuits and Systems-II: Analog and Digital Signal Processing* 48:11:1014-1027 (Nov. 2001).

Welz, J. and Galton, I., "A Necessary and Sufficient Condition for Mismatch Shaping in Multi-bit DACS," *IEEE*, pp. 1-105 through 108 (2002), unknown month.

Yasuda, A. et al., "A Third-Order Δ-Σ Modulator Using Second-Order Noise Shaping Dynamic Element Matching," *IEEE Journal of Solid-State Circuits* 33:12:1879-1886 (Dec. 1998).

Zelniker, G. and Taylor, F., "Chapter 7: Multirate Signal Processing" in *Advance Digital Signal Processing: Theory and Applications*, Marcel Dekker, Inc., New York, NY, pp. 343-361 (1994), unknown month.

\* cited by examiner

Conventional Art

HARDWARE-EFFICIENT IMPLEMENTATION OF DYNAMIC ELEMENT MATCHING IN SIGMA-DELTA DAC'S

CROSS-REFERENCE TO RELATED APPLICATIONS

This application is a continuation of U.S. patent application Ser. No. 10/812,975, filed Mar. 31, 2004, which is a continuation of U.S. patent application Ser. No. 10/354,159, filed Jan. 30, 2003, and is related to U.S. patent application Ser. No. 10/225,353, filed Aug. 22, 2002 now U.S. Pat. No. 6,762,702, entitled Shuffler Apparatus and Related Dynamic Element Matching Technique for Linearization of Unit-Element Digital-To-Analog Converters, all of which are incorporated herein by reference in their entirety.

BACKGROUND OF THE INVENTION

In high resolution digital-to-analog converters (DACs), performance metrics such as linearity and noise are nominally determined by the matching of parameters derived from physical quantities in the construction of the DACs on an integrated circuit (IC), such as width, length, thickness, doping, etc. As a general rule, for each additional bit of performance in the DAC, parameter matching needs to be twice as tight. This translates to an increase by a factor of four in the IC area required by the DAC. When the DAC resolution is in the 16-bit range, it is no longer practical/economical to use size alone to achieve the required matching.

Over-sampled (sigma-delta) DACs (also referred to as "converters") alleviate the need for raw matching using single-bit conversion (so called 1-bit DACs in CD players). A single-bit DAC has only two points in a transfer function of the DAC, and thus is inherently linear. The function of a sigma-delta modulator with a one-bit quantizer is to approximate a high resolution low frequency signal with a high frequency two-level signal. The drawback here is this produces large amounts of out-of-band, for example, high frequency, noise.

One solution is to use more than two levels of quantization. For example, 17 levels may be used. However, now the linearity requirements apply to the full resolution of the DAC. That is, for a 16-bit DAC, the transfer function of the DAC with these quantization levels must be collinear to 1 part in $2^{16}$, which is 1 part in 65,536. Such linearity is difficult to achieve with raw parameter matching of the single-bit DACs. Thus, there is need to achieve such linearity in a multi-level DAC using an alternative to raw parameter matching.

Multi-bit DACs have the advantage of significantly increasing the precision limit of the single-bit converter. The major drawback of the multi-bit DAC is the non-linearity presented by the imperfect analog circuit mismatches. Specifically, the non-linearity stems from the mismatching between the unit DAC elements, and causes significant performance degradation. Since the multi-bit DAC is outside the Δ-Σ modulator, its error cannot be eliminated by the noise-shaping loop of the Δ-Σ modulator, while the quantization noise inside the Δ-Σ modulator can be noise-shaped by the Δ-Σ modulator feedback loop.

There has been a lot of literatures discussing about ways to noise-shape the mismatching error. See, e.g., I. Galton, "Spectral Shaping of Circuit Errors in Digital-to-Analog Converters", IEEE Trans. on Circuits and Systems-II: Analog and Digital Signal Processing, pp. 808–817, vol. 44, no. 10, October 1997; J. Grilo et al., "A 12-mW ADC Delta-Sigma Modulator with 80 dB of Dynamic Range Integrated in a Single-Chip Bluetooth Transceiver", IEEE Journal of Solid-State Circuits, pp. 271–278, vol. 37, March 2002; J. Welz, I. Galton, and E. Fogleman, "Simplified Logic for First-Order and Second-Order Mismatch-Shaping Digital-to-Analog Converters", IEEE Trans. on Circuits and Systems-II. Analog and Digital Signal Processing, pp. 1014–1027, vol. 48, no. 11, November 2001; R. Adams et al., "A 113-dB SNR Oversampling DAC with Segmented Noise-Shaped Scrambling", IEEE Journal of Solid-State Circuits, pp. 1871–1878, vol. 33, no. 12, December 1998; T. Kwan et al., "A Stereo Multibit FA DAC with Asynchronous Master-Clock Interface", IEEE Journal of Solid-State Circuits, pp. 1881–1887, vol. 31, no. 12, December 1996; A. Yasuda et al., "A Third-Order Δ-Σ Modulator Using Second-Order Noise-Shaping Dynamic Element Matching", IEEE Journal of Solid-State Circuits, pp. 1879–1886, vol. 33, no. 12, December 1998; R. Radke et al., "A Spurious-Free Delta-Sigma DAC Using Rotated Data Weighted Averaging", IEEE Custom Integrated Circuits Conference, 1999, pp. 125–128; R. Radke and T. S. Fiez, "Improved ΣΔ. DAC linearity using data weighted averaging", IEEE International Symposium, vol. 1, pp. 13–16, 1995; R. Radke et al., "A 14-bit Current-Mode ΣΔ DAC Based Upon Rotated Data Weighted Averaging", IEEE Journal of Solid-State Circuits, vol. 35, no. 8, August 2000. The tree-structure (see I. Galton; J. Grilo et al.; and J. Welz et al., cited above) is one of the best noise-shaping structure, in which the input thermometer code is split into two numbers, which then into four numbers, and so on. The swapping cells is controlled by the Parity Detector outputs, and internally performing arithmetic operations to switch the inputs. The tree-structure results in controlled spectral shaping of the DAC mismatch errors. However, some residual non-linearity due to the DEM remains.

SUMMARY OF THE INVENTION

The present invention is directed to a hardware-efficient implementation of dynamic element matching in sigma-delta DAC's, that substantially obviates one or more of the problems and disadvantages of the related art.

There is provided a data shuffler apparatus for shuffling input bits including a plurality of bit shufflers each inputting corresponding two bits $x_0$ and $x_1$ of the input bits and outputting a vector $\{x_0', x_1'\}$ such that

| Current State | Input Bits | Next State | Vector $\{x_0', x_1'\}$ |
|---|---|---|---|
| $S_0$ (0) | $x_0 = x_1$ | $S_0$ (0) | $\{x_0, x_1\}$ |
| $S_0$ (0) | $x_0 \neq x_1$ | $S_1$ (1) | $\{x_1, x_0\}$ |
| $S_1$ (1) | $x_0 = x_1$ | $S_1$ (1) | $\{x_0, x_1\}$ |
| $S_1$ (1) | $x_0 \neq x_1$ | $S_0$ (0) | $\{x_0, x_1\}$ |

At least two 4-bit vector shufflers input the vectors $\{x_0', x_1'\}$ and output 4-bit vectors each corresponding to a combination of two vectors $\{x_0', x_1'\}$, such that the 4-bit vector shufflers operate on the vectors $\{x_0', x_1'\}$ in the same manner as the bit shufflers operate on the bits $x_0$ and $x_1$. The current state of the bit shufflers is updated based on a next state of the 4-bit vector shufflers.

In another aspect there is provided a data shuffler apparatus for shuffling input bits including a plurality of bit shufflers each inputting corresponding two bits $x_0$ and $x_1$ of the input bits and outputting a vector $\{x_0', x_1'\}$ such that a number of 1's at bit $x_0'$ over time is within ∀1 of a number of 1's at bit $x_1'$. At least two 4-bit vector shufflers input the vectors $\{x_0', x_1'\}$, and output 4-bit vectors, each 4-bit vector corresponding to a combination of corresponding two vectors $\{x_0', x_1'\}$ produced by the bit shufflers, such that the 4-bit vector shufflers operate on the vectors $\{x_0', x_1'\}$ in the same manner as the bit shufflers operate on the bits $x_0$ and $x_1$. The current state of the bit shufflers is updated based on a next state of the 4-bit vector shufflers.

In another aspect there is provided a digital to analog converter including an interpolation filter receiving an N-bit digital input. A delta-sigma modulator receiving an output of the interpolation filter. A dynamic element matching encoder receives N bits from the delta-sigma modulator, and outputs an analog signal corresponding the digital input. The dynamic element matching encoder includes a plurality of bit shufflers each inputting two bits $x_0$ and $x_1$ of the N bits, and outputting a vector $\{x_0', x_1'\}$ such that a number of 1's at bit $x_0'$ over time is within ∀1 of a number of 1's at bit $x_1'$. A plurality of vector shufflers arranged both in parallel and in successive levels input the vectors $\{x_0', x_1'\}$ and output vectors each corresponding to a combination of vectors produced by a previous set of shufflers. The vector shufflers operate on their respective input vectors in the same manner as the bit shufflers operate on the bits $x_0$ and $x_1$. The current state of the bit shufflers is updated based on a next state of the last level of the vector shufflers.

In another aspect there is provided a method of shuffling a plurality of input bits including converting each set of bits $x_0$ and $x_1$ into a vector $\{x_0', x_1'\}$ such that

| Current State | Input Bits | Next State | Vector $\{x_0', x_1'\}$ |
| --- | --- | --- | --- |
| $S_0$ (0) | $x_0 = x_1$ | $S_0$ (0) | $\{x_0, x_1\}$ |
| $S_0$ (0) | $x_0 \neq x_1$ | $S_1$ (1) | $\{x_1, x_0\}$ |
| $S_1$ (1) | $x_0 = x_1$ | $S_1$ (1) | $\{x_0, x_1\}$ |
| $S_1$ (1) | $x_0 \neq x_1$ | $S_0$ (0) | $\{x_0, x_1\}$ | inputting the vectors $\{x_0', x_1'\}$ and outputting 4-bit vectors each corresponding to a shuffled combination of two vectors $\{x_0', x_1'\}$, in the same manner as the bits $x_0$ and $x_1$ are shuffled, updating the current state and for shuffling the bits $x_0$ and $x_1$ based on a next state corresponding to the 4-bit vectors; and continuously repeating the previous steps.

In another aspect there is provided a method of converting a digital signal to an analog signal including filtering the digital signal with an interpolation filter, modulating an output of the interpolation filter with a delta-sigma modulator to produce an N bit signal, receiving the N bits from the delta-sigma modulator, shuffling each set of bits $x_0$ and $x_1$ of the N bits and outputting a vector $\{x_0', x_1'\}$ such that a number of 1's at $x_0'$ over time is within ∀1 of a number of 1's at bit $x_1'$, converting the vectors $\{x_0', x_1'\}$ into 4-bit vectors each corresponding to a combination of two vectors $\{x_0', x_1'\}$, such that the 4-bit vectors are shuffled in the same manner as the bits $x_0$ and $x_1$, updating a current state and for shuffling the bits $x_0$ and $x_1$ based on a next state used for shuffling the 4-bit vectors, and outputting an analog signal corresponding to the digital signal.

Additional features and advantages of the invention will be set forth in the description that follows. Yet further features and advantages will be apparent to a person skilled in the art based on the description set forth herein or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the exemplary embodiments of the invention and are incorporated in and constitute a part of this specification, illustrate embodiments of the invention and together with the description serve to explain the principles of the invention. In the drawings.

DETAILED DESCRIPTION OF THE INVENTION

Reference will now be made in detail to the embodiments of the present invention, examples of which are illustrated in the accompanying drawings.

As used herein, the terms "logic bits," "logic signals," and "bits" are used interchangeably to refer to the same signals. Also, the terms "high-level bit," "logic '1'", and "logic-one," are interchangeable, as are the terms "low-level bit," logic '0'", and "logic-zero."

Figure 1:
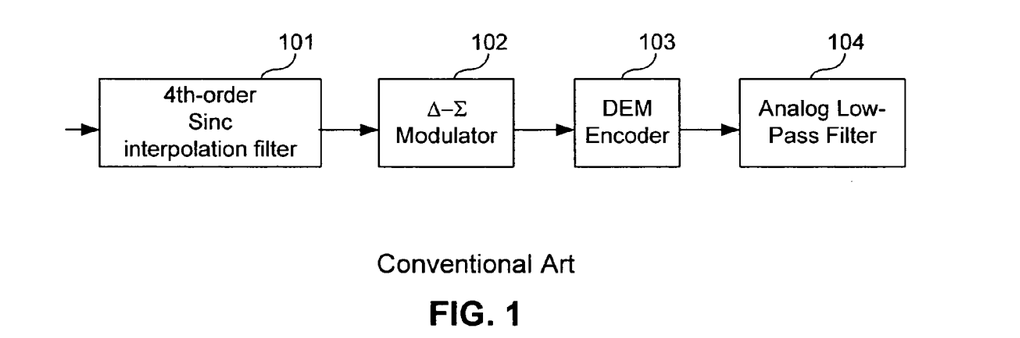
FIG. 1 shows a block diagram of a conventional 4-bit Σ-Δ digital to analog converter.

The Σ-Δ digital-to-analog converters are widely used in high-precision, low-bandwidth applications such as digital audio processing. FIG. 1 shows the block diagram of a conventional 4-bit Σ-Δ DAC with preceding and post filtering. As shown in FIG. 1, the 4-bit Σ-Δ DAC includes a Sinc interpolation filter 101 (for example, a $4^{th}$ order Sinc filter that takes the digital input). The Sinc interpolation filter 101 outputs filtered data to a Δ-Σ modulator 102. The Δ-Σ modulator 102 outputs the data to a DEM encoder 103. The output of the DEM encoder 103 is then low pass filtered by filter 104. The DEM (Dynamic Element Matching) Encoder block preceding the 9-level DAC noise-shapes the DAC mismatching error.

This disclosure describes a more hardware-efficient implementation than the tree-structure implementation. A balanced code is introduced. Modulation of the mismatch error is explained. The detailed implementation of the swapping cell is presented, along with the simulation results.

Figure 2:
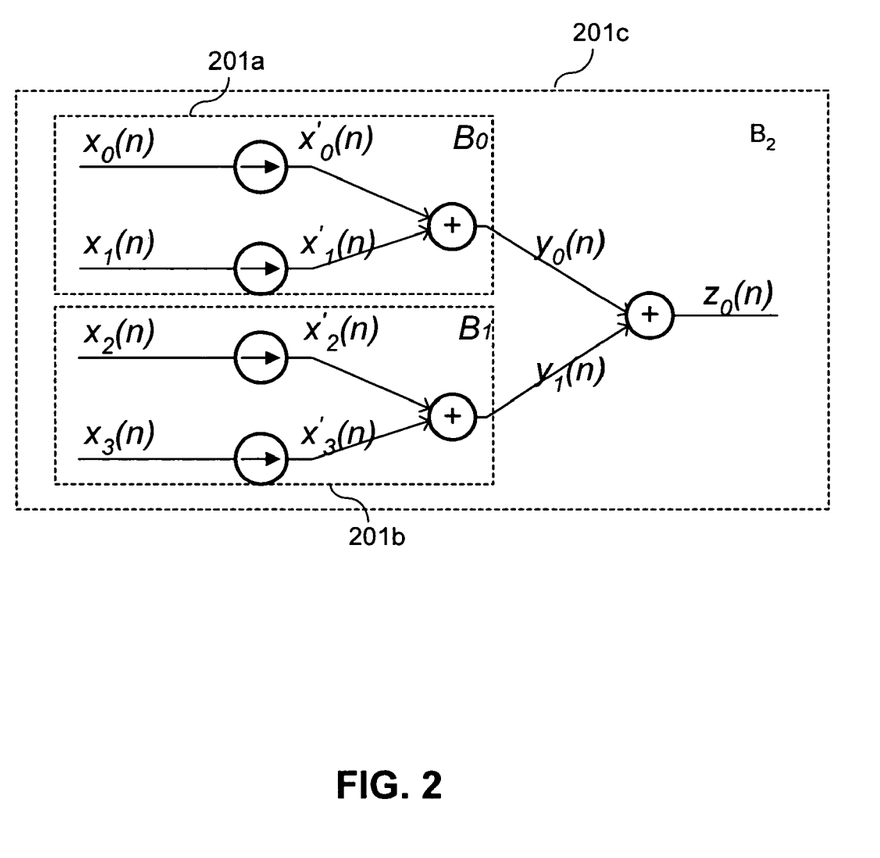
FIG. 2 shows a 4-bit digital to analog converter structure.

FIG. 2 illustrates a 4-bit Σ-Δ DAC structure. A unit DAC element 201 operates according to $$x_0' = \begin{cases} 1 + e_{h_0}, & \text{if } x_0(n) = 1 \\ e_{l_0}, & \text{if } x_0(n) = 0 \end{cases} \qquad \text{Eq. (1)}$$

where $e_{h_0}$ and $e_{l_0}$ are the analog output errors for one and zero input, respectively.

Eq. (1) can be rewritten as $$x_0' = (1 + e_{h_0} - e_{l_0}) x_0 + e_{l_0} \qquad \text{Eq. (2)}$$

and the output of the unit DAC element 201A $y_0(n)$ in FIG. 2 can be written as $$\begin{aligned} y_0(n) &= (1 + e_{h_0} - e_{l_0}) x_0(n) + e_{l_0} + (1 + e_{h_1} - e_{l_1}) x_1(n) + e_{l_1} \quad \text{(Eq. (3))} \\ &= (1 + e_{h_0} - e_{l_0} + 1 + e_{h_1} - e_{l_1}) \\ &\quad \frac{x_0(n) + x_1(n)}{2} + (e_{h_0} - e_{l_0} - (e_{h_1} - e_{l_1})) \\ &\quad \frac{x_0(n) - x_1(n)}{2} + e_{l_0} + e_{l_1} \end{aligned}$$

Note that the Eq. (3) also applies to $y_1(n)$ and $z_0(n)$ with the appropriate inputs, due to the recursive nature of the structure in FIG. 2. For the same reason, the discussion will focus on the building block $B_0$ (201a) in FIG. 2, the results are applicable to the blocks $B_1$ (201b) and $B_2$ (201c). The second term in Eq. (3) represents the mismatch error between the two elements, and is defined as $$\begin{aligned} \Delta(n) &= (e_{h_0} - e_{l_0} - (e_{h_1} - e_{l_1})) \qquad \text{Eq. (4)} \\ &\quad \frac{x_0(n) - x_1(n)}{2} \\ &= \varepsilon_{01}(x_0(n) - x_1(n)) \end{aligned}$$

where $$\varepsilon_{01} = \frac{e_{h_0} - e_{l_0} - (e_{h_1} - e_{l_1})}{2}$$

is the mismatch coefficient between unit DAC elements 0 and 1. There are four possible combinations for $x_0(n)x_1(n)$: "00", "01", "10", "11". The first and the last combinations have no contributions to $\Delta(n)$ since the input pair $x_0(n)$ and $x_1(n)$ are equal. Only combinations $x_0(n)x_1(n)$="01" and "10" contribute mismatching errors to $\Delta(n)$.

There are quite a few techniques of implementing the first-order noise-shaping of the DAC errors. To preserve the first-order noise-shaping, the DAC elements 201 must be selected such that the mismatching error, $\Delta(n)$, quickly sums to zero. To this end, it is the best to make the opposite polarity for the subsequent occurrence of the "01" or "10", so that the mismatch error cancelled out quickly. For example, to represent four consecutive 1's in the DAC output, the noise shaping requires $x_0(n)x_1(n)$ to sequence through {"01", "10", "01", "10"}, as oppose to {"01", "10", "10", "01"}, because the latter sequence cancels the error in four cycles while the former sequence cancels the error in just two cycles.

Figure 3:
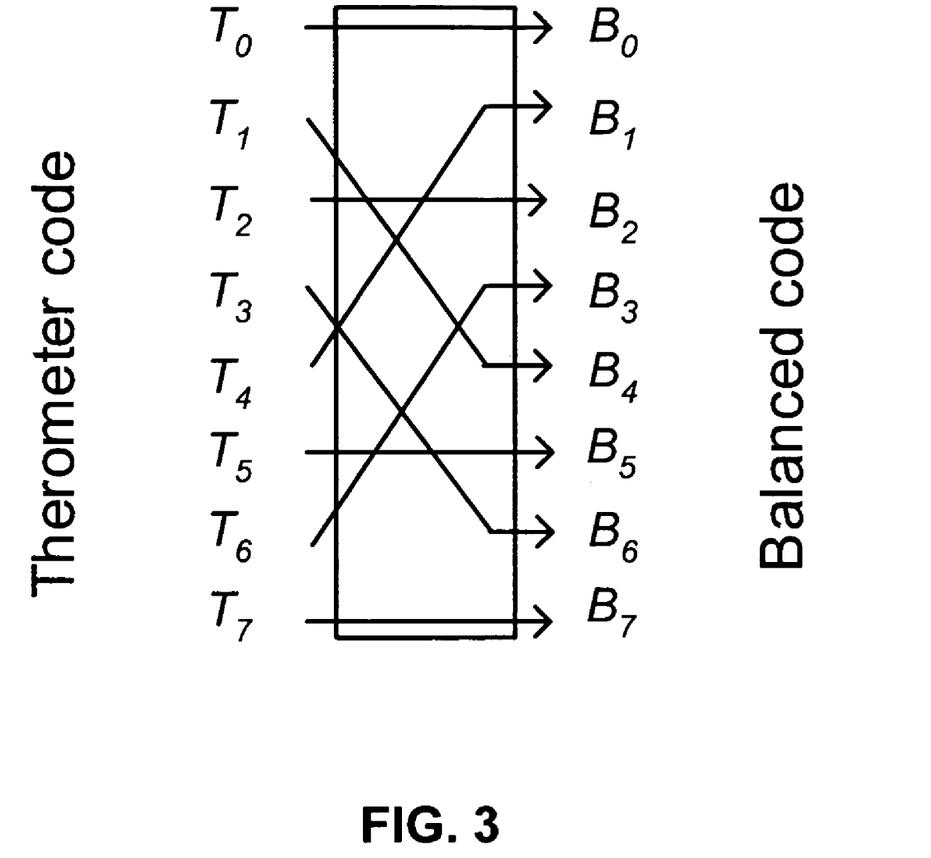
FIG. 3 shows a conversion of a thermometer code to a balanced code.

Since the order of "10" and "01" are important to the $\Delta(n)$, it would be best to confine the input to just one pattern, such as "10" only, to facilitate the subsequent DEM Encoder 103 switching rules for noise-shaping. The balanced code is proposed, as shown in the Table 1 below. This code is the input (instead of the conventional thermometer code) to the proposed DEM Encoder 103. FIG. 3 shows the conversion between the thermometer code and the balanced code, with no logic but wire-routing only. This conversion is necessary for DAC application whose output is thermometer code.

TABLE 1

Balanced code vs. thermometer code

| Input decimal | Balanced code [B₀B₁B₂B₃B₄B₅B₆B₇] | Thermometer code [T₀T₁T₂T₃T₄T₅T₆T₇] |
|---|---|---|
| 8 | QA = 8'b1111_1111; | 8'b1111_1111; |
| 7 | QA = 8'b1111_1110; | 8'b1111_1110; |
| 6 | QA = 8'b1110_1110; | 8'b1111_1100; |
| 5 | QA = 8'b1110_1010; | 8'b1111_1000; |
| 4 | QA = 8'b1010_1010; | 8'b1111_0000; |
| 3 | QA = 8'b1010_1000; | 8'b1110_0000; |
| 2 | QA = 8'b1000_1000; | 8'b1100_0000; |
| 1 | QA = 8'b1000_0000; | 8'b1000_0000; |
| 0 | QA = 8'b0000_0000; | 8'b0000_0000; |

As shown in Table 1, there are two properties for the balanced code: 1) the balanced code is maximally balanced with respect to the centerlines of the entire code, half codes, and quadruple codes, and 2) the order of "1" and "0" are consistent throughout the code. For example, the code for decimal 3 in the Table 1 cannot be 8'b1000_1010, because the rest of the codes, such as 7, 5 and 1 always have a "1" that appears on the left-hand-side first. Both properties make the DEM Encoder 103 easy to implement.

With the balanced code as illustrated in Table 1, the combinations of $x_0(n)x_1(n)$ are reduced to "00", "11", "10", and the first two contribute no errors to $\Delta(n)$. A simple way to noise-shape the mismatching error $\Delta(n)$ associated with the input $x_0(n)x_1(n)$="10" is modulating the $x_0(n)-x_1(n)$. In another words, the input $\{x_0(n), x_1(n)\}$ is swapped for every even occurrence of "10". For example, assume the input is a constant, with repeated strings of "10". For the first "10", its order is kept, and the output $\Delta(1)$ in Eq. (4) is $\epsilon_{01}$. For the second "10", its order is swapped, and $\Delta(2)$ is $-\epsilon_{01}$, so the output $\Delta(n)$ sequence is $\{\epsilon_{01}, -\epsilon_{01}, \epsilon_{01}, -\epsilon_{01}, \ldots\}$, which is a high-frequency modulated noise. It does not matter whether the input sequence of "00" and "11", is swapped or not, because the associated $\Delta(n)$ is zero, as shown in Eq. (4). In the actual implementation, the order for the equal inputs is kept as is.

Figure 4A:
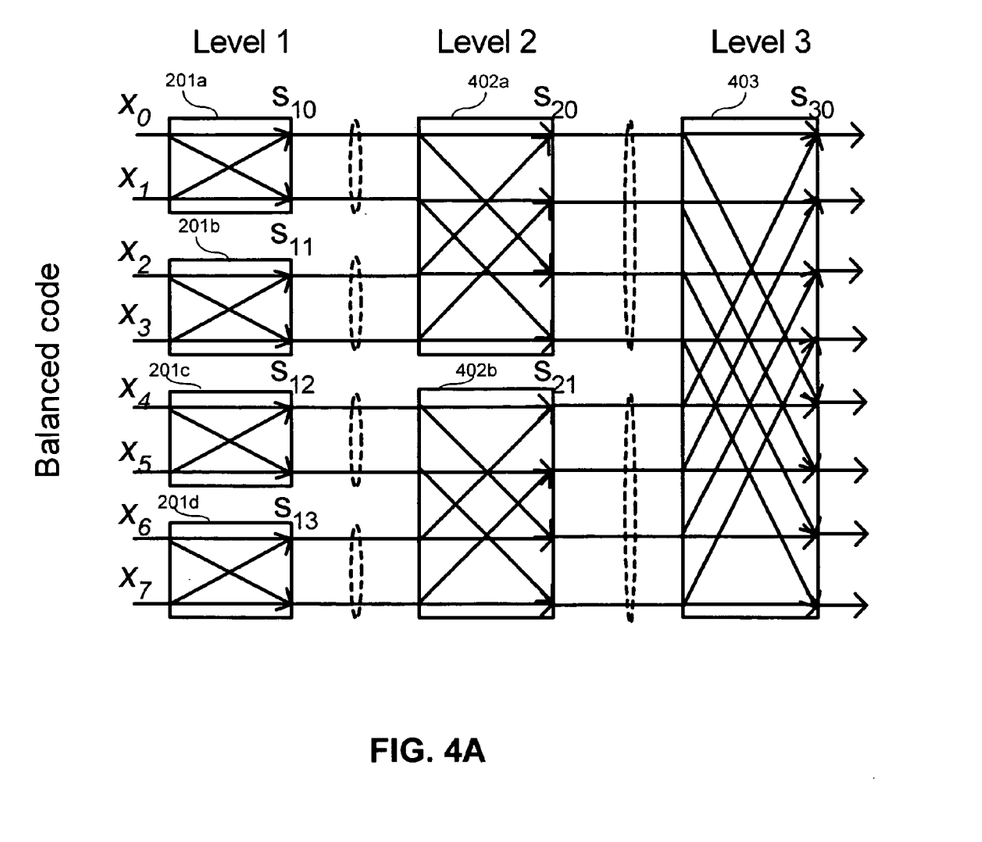
FIG. 4A shows connection of swapper cells.

FIG. 4A is the diagram of the swap-cell connections. As shown in FIG. 4A, for an 8-bit digital analog converter, the first level of conversion uses 4 shufflers, or swapper cells, 201, which were illustrated in FIG. 2. Each swapper cell, or shuffler, takes 2 bits as input, and outputs 2 bits (swapped, or not swapped, as described above) to the next level, i.e., Level 2. There are two Level 2 swappers 402, each of which takes four inputs, that are grouped into vectors. $x_0$ and $x_1$ form one vector, and $x_2$ and $x_3$ form a second vector, for the first Level 2 swapper 402a; similarly, for the second Level 2 swapper 402b, $X_4$ and $x_5$ form a first vector, and $x_6$ and $x_7$ form a second vector. Note that both swappers 402a, 402b operate on the vectors, rather than on the individual bits, although the swapping operation is the same conceptually as that for the single-bit swappers 201.

A Level 3 swapper 403 operates on the vectors outputted by Level 2 swappers 402a and 402b, as shown in FIG. 4A. Conceptually, the swapping operation is the same as for the swappers 201.

Figure 4B:
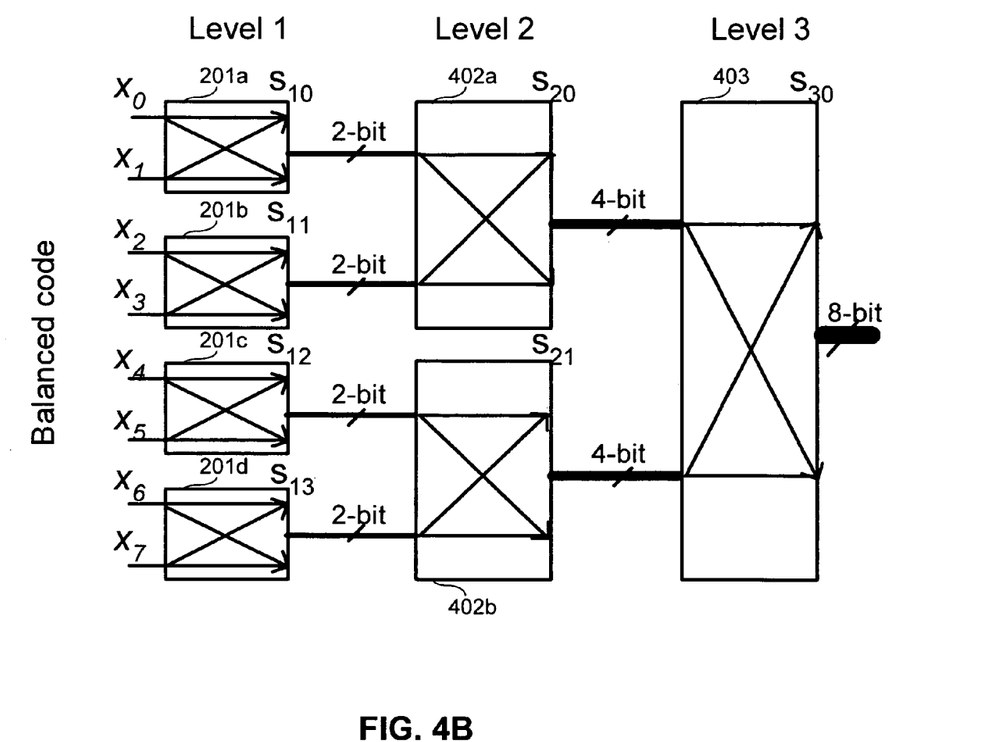
FIG. 4B shows an equivalent representation of FIG. 4A using buses.

FIG. 4B is an equivalent representation grouping the associated bits into buses. The swapper 403 permutes depending upon its current state and the current input $\{x_0, x_1, \ldots, x_7\}$. Seven registers are used as the state registers corresponding to the seven swappers of FIG. 4B, with states S0 and S1, to track the states of the seven swappers. Current state of S1 indicates the swapper has switched, and it will not switch next time. Current state of S0 indicates the swapper has not switched this time, and it will (or not) switch if the current input is $\overline{EQ}$ (or EQ). These state registers track the permutation history of the swappers throughout the three levels.

Figure 5:
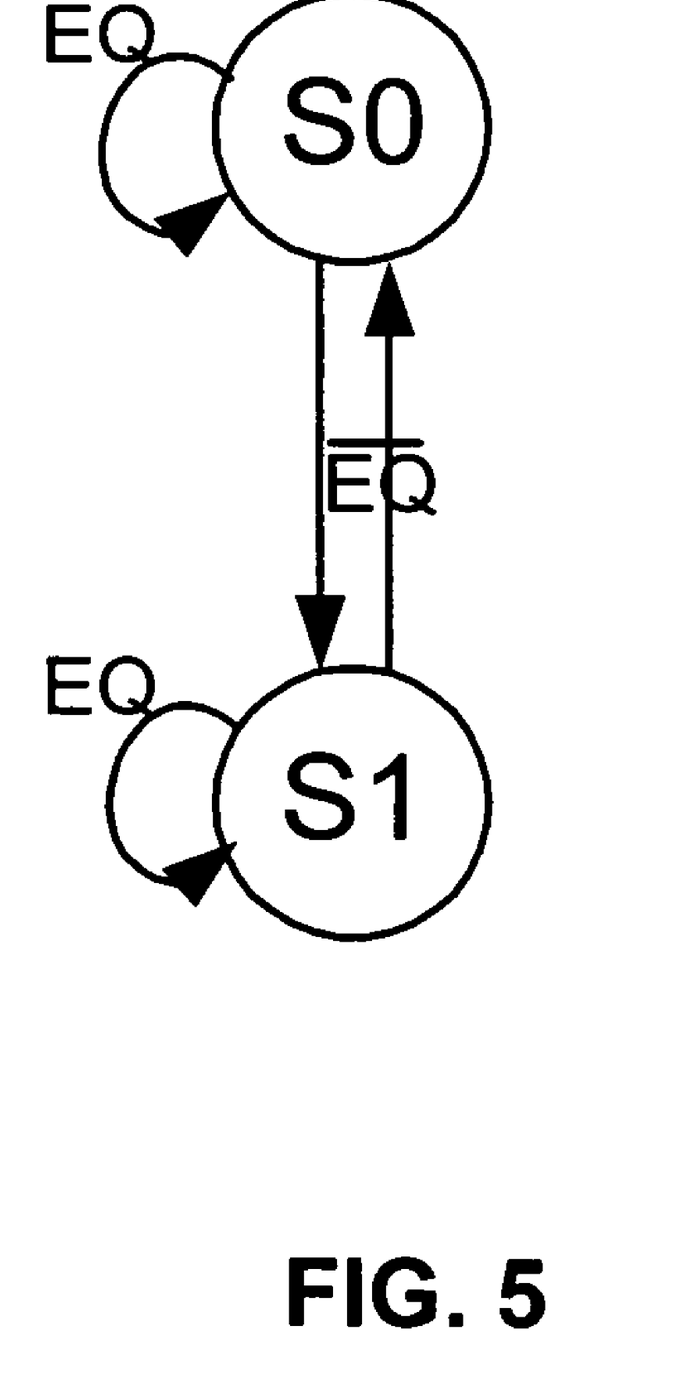
FIG. 5 shows a state transition diagram for a shuffler unit of FIG. 4A.

A state transition diagram is shown in FIG. 5, where EQ asserts for the symmetric input code with respect to the code's centerline, such as "00" and "11" for Level 1, and $\overline{EQ}$ asserts for the "10" input for Level 1. The state diagram in FIG. 5 applies to all three levels of FIG. 4A. For Level 2, the inputs "00_00", "10_10", and "11_11" are considered as EQ, while the others are considered as $\overline{EQ}$. For example, assume an input code of $\{x_0, x_1, \ldots, x_7\} = \{11\_10\_10\_10\}$, then we have EQ, $\overline{EQ}$, $\overline{EQ}$, $\overline{EQ}$, $\overline{EQ}$, EQ, and $\overline{EQ}$ assert for swappers 201, 402 and 403 (ouputs $S_{10}$, $S_{11}$, $S_{12}$, $S_{13}$, $S_{20}$, $S_{21}$, and $S_{30}$), respectively.

Table 2 below gives the truth table of the finite-state-machine in FIG. 5.

TABLE 2

Truth Table for the finite-state-machine and swapper-cell control.

| Current State (SC) | Input Pair Equal | Next State (SN) | Swap Control (CTRL) |
|---|---|---|---|
| $S_0$ (0) | EQ (0) ($x_0 = x_1$) | $S_0$ (0) | 0 |
| $S_0$ (0) | $\overline{EQ}$ (1) ($x_0 \neq x_1$) | $S_1$ (1) | 1 |
| $S_1$ (1) | EQ (0) ($x_0 = x_1$) | $S_1$ (1) | 0 |
| $S_1$ (1) | $\overline{EQ}$ (1) ($x_0 \neq x_1$) | $S_0$ (0) | 0 |

Figure 6:
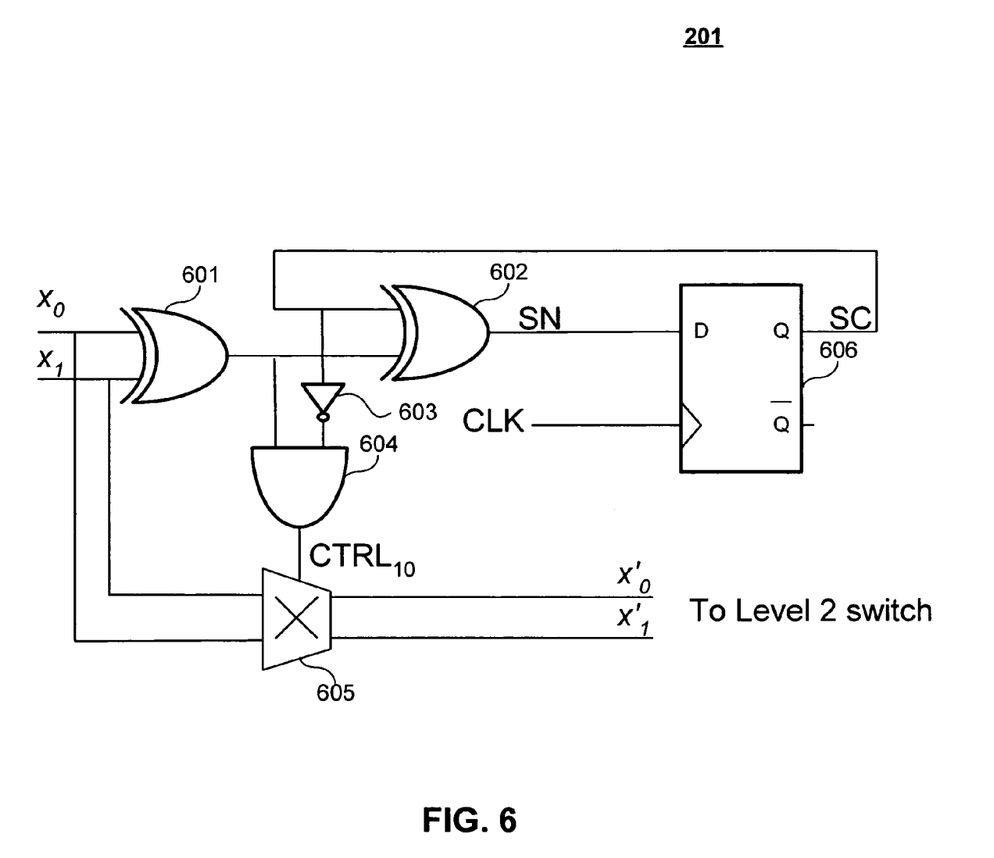
FIG. 6 shows a hardware implementation of the shuffler of FIG. 4A.

The logic for the Next State (SN) and the swapper control (CTRL) are respectively: SN=XOR(SC, XOR(IN)), CTRL=AND(NOT(SC), XOR(IN)). The circuit implementation of the switching box is shown in FIG. 6. As shown in FIG. 6, a swapper cell 201 includes an XOR gate 601 taking as inputs $x_0$ and $x_1$. The output of the XOR gate 601 is fed into another XOR gate 602, and an AND gate 604. A multiplexer 605 is controlled by the output of the AND gate 604. The output of the XOR gate 602 is fed into a DQ flip flop 606 and also represents the Next State SN. The Q output of the DQ flip flop 606, which also represents the Current State SC is fed back into the XOR gate 602, and through an inverter 603 to the AND gate 604. The outputs of the multiplexer 605, which is controlled by the output of the AND gate 604, represent $x'_0$ and $x'_1$, and are fed in vector form to the Level 2 swapper 402. The circuit of FIG. 6 also represents each of swappers 402 and 403, except that $x_0$ and $x_1$ and $x'_0$ and $x'_1$ are replaced by appropriate multiple-bit vectors.

Table 2 is similar to the control logic of the scrambler in R. Adams, K. Nguyen, and K. Sweetland, "A 113-dB SNR Oversampling DAC with Segmented Noise-Shaped Scrambling", *IEEE Journal of Solid-State Circuits*, pp. 1871–1878, vol. 33, no. 12, December 1998 and T. Kwan, R. Adams, and R. Libert, "A Stereo Multibit ΣΔ DAC with Asynchronous Master-Clock Interface", *IEEE Journal of Solid-State Circuits*, pp. 1881–1887, vol. 31, no. 12, December 1996, however, the logic in FIG. 6 is applied at all the three levels. In other words, the inputs $x_0$ and $x_1$ in FIG. 6 are 1-bit, 2-bit and 4-bit at Level 1, 2 and 3, respectively. However, in the scrambler of Adams et al., the inputs $x_0$ and $x_1$ are always 1-bit, with its optimized routings between different levels.

Figure 7:
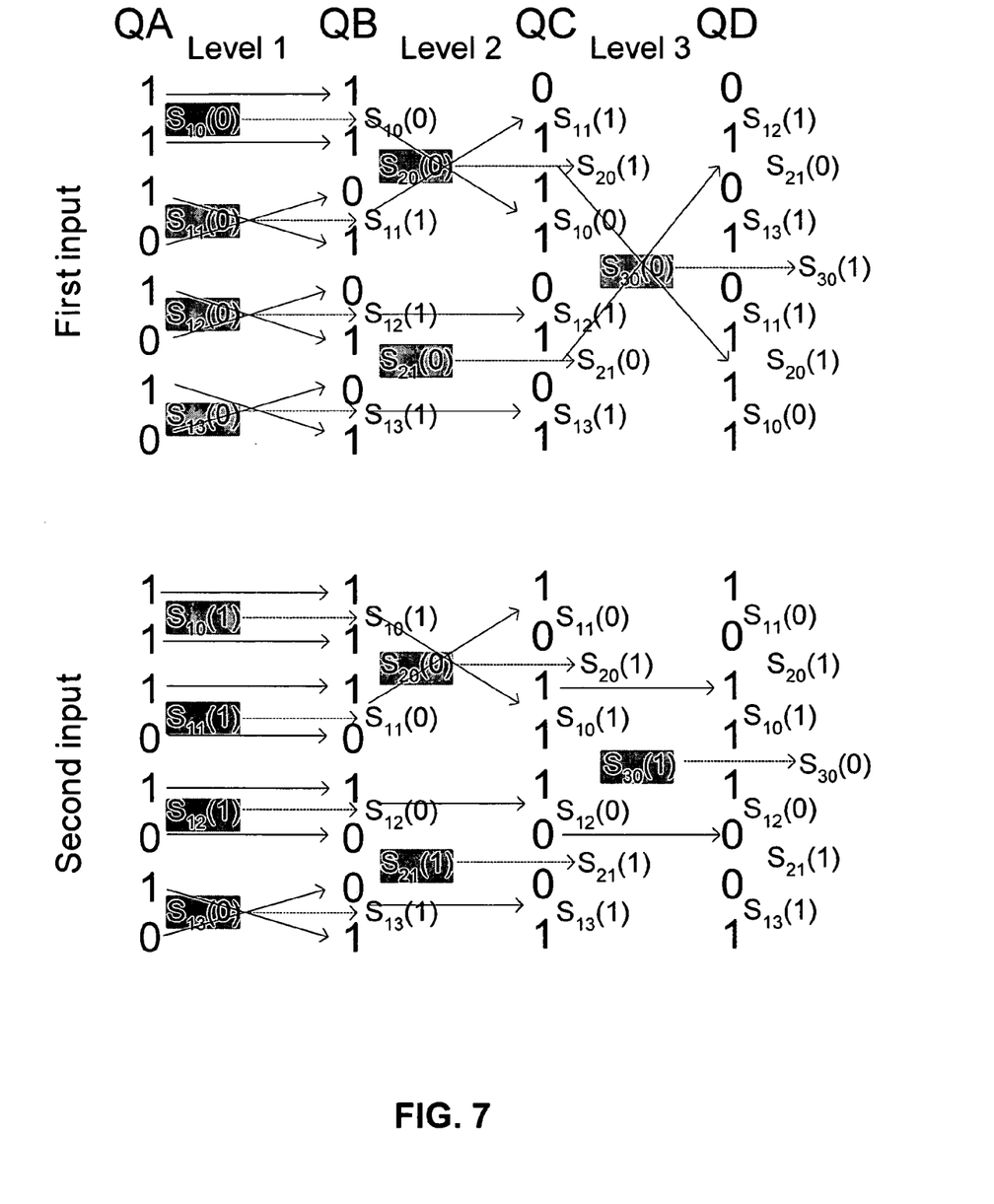
FIG. 7 shows a sequencing example for a dynamic element matching encoder.

FIG. 7 shows an example of the switching sequence for the two consecutive inputs of QA="1110_1010". The state $S_{ij}$, with its value inside the parenthesis, corresponds to the swapper states $S_{ij}$ in FIG. 4B, QB, QC, and QD are the output at the Level 1, 2, and 3, respectively. QD is also the final output. The shaded states are the initial states. The states besides the QD are the final states, whose values are inherited by the initial states for the next input.

For the first input QA="1110_10_10_10", the states are: State_QA=$\{S_{10}, S_{11}, S_{12}, S_{13}, S_{20}, S_{21}, S_{30}\}$ with a value of $\{0, 0, 0, 0, 0, 0, 0\}$.

For the Level 1 swapper cells $S_{10}$, $S_{11}$, $S_{12}$, and $S_{13}$, the inputs "11", "10", "10", and "10" are considered as EQ, $\overline{EQ}$, $\overline{EQ}$, $\overline{EQ}$, respectively. Therefore the 201a ($S_{10}$) state cell passes through, while the other cells permute as shown. After the level 1 permutation, the states become: State_QB=$\{S_{10}, S_{11}, S_{12}, S_{13}, S_{20}, S_{21}, S_{30}\}$ with a value of $\{0, 1, 1, 1, 0, 0, 0\}$.

For the Level 2 swapper cells 402 ($S_{20}$ and $S_{21}$ states), the QA inputs "11_10" and "10_10" are $\overline{EQ}$ and EQ, respectively. Therefore the cell 402a permutes, and the 402b cell passes through. When the 402a cell permutes, its sub-cells 201a and 201b follow its permutation. After the Level 2 permutation, the states become: State_QC=$\{S_{11}, S_{10}, S_{12}, S_{13}, S_{20}, S_{21}, S_{30}\}$ with a value of $\{1, 0, 1, 1, 1, 0, 0\}$.

For the Level 3 swapper cell 403, the QA input "1110_1010" is $\overline{EQ}$, therefore the swapper cell 403 permutes, and the sub-cells 201 and 402 follow its permutation. After the Level 3 permutation, the states are: State_QD=$\{S_{12}, S_{13}, S_{11}, S_{10}, S_{21}, S_{20}, S_{30}\}$ with value of $\{1, 1, 1, 0, 0, 1, 1, \}$.

Thus, the first output of QD="01_01_01_11" is obtained with the associated state value of $\{1, 1, 1, 0, 0, 1, 1\}$, which is to be inherited as the initial state value of the second input. In the actual implementation, State_QA and State_QB need only 4 bits, and 6 bits to carry all the information.

For the second sample QA="1110_1010" (lower half of FIG. 7), the states are: State_QA=$\{S_{10}, S_{11}, S_{12}, S_{13}, S_{20}, S_{21}, S_{30}\}$ with value of $\{1, 1, 1, 0, 0, 1, 1\}$.

After the Level 1 permutation, the states become: State_QB=$\{S_{10}, S_{11}, S_{12}, S_{13}, S_{20}, S_{21}, S_{30}\}$ with value of $\{1, 0, 0, 1, 0, 1, 1\}$.

After the Level 2 permutation, the states become: State_QC=$\{S_{10}, S_{11}, S_{12}, S_{13}, S_{20}, S_{21}, S_{30}\}$ with value of $\{0, 1, 0, 1, 1, 1, 1\}$.

After the Level 3 permutation, the states become: State_QD=$\{S_{11}, S_{10}, S_{12}, S_{13}, S_{20}, S_{21}, S_{30}\}$ with value of $\{0, 1, 0, 1, 1, 1, 0\}$.

It will also be appreciated that while the discussion above has been primarily in terms of an 8-bit and digital to analog converter, the invention is not limited to an 8-bit implementation, but is equally applicable to 16-bits, 32-bits, 64-bits, or $2^N$ converter.

Figure 8A:
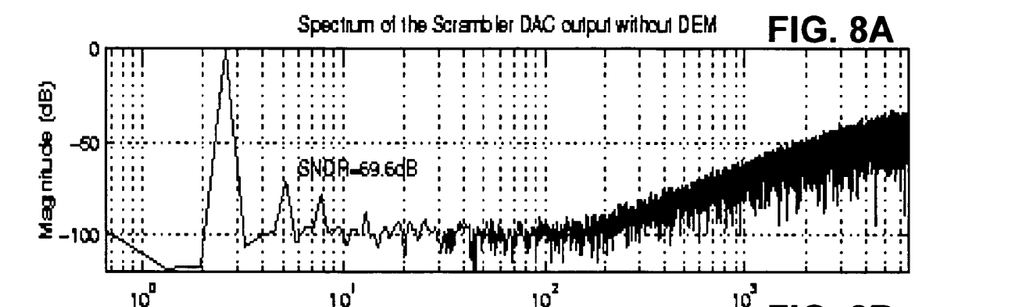
FIGS. 8A–8C show a spectrum of a digital to analog converter output with DAC mismatch and DEM.
Figure 8B:
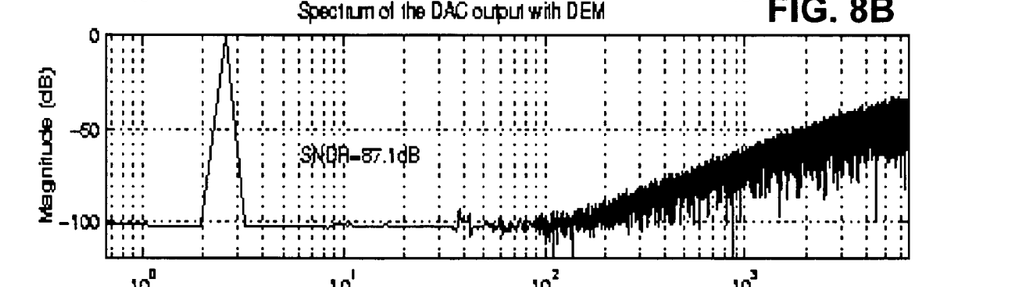
Figure 8C:
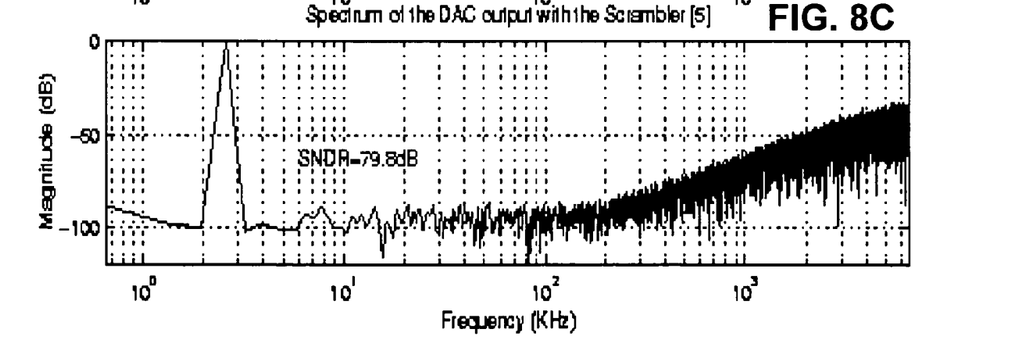

FIGS. 8A–8C show a spectrum of the DAC output with and without the proposed implementation. The DAC signal-to-noise plus distortion ratio (SNDR) is 57.5 dB and 71.4 dB for 5% and 1% mismatch error. With the proposed implementation, the SNDR goes up to 88.5 dB, almost the same as the SNDR when the DAC has no mismatching error.

The differences between the proposed method and the tree-structure in I. Galton; J. Grilo et al., and J. Welz et al. are the followings:

1) A balanced code is being used, as oppose to the thermometer code.
2) No tree-structure in the proposed implementation, and connections of swapper cell are different.
3) Swapping cell logic is simpler.
4) The parity detector in FIG. 8 in Grilo et al. is done a posteriori to the cell switching, therefore there is a loop involved in the tree-structure in FIG. 8 in Grilo et al. The mechanism to reduce the loop latency (FIG. 9 in Grilo et al.) and strict timing (FIG. 10 in Grilo et al.) is not necessary. In the description herein, the input pair equality check in done prior to the cell switching, no feedback loop involved, therefore the implementation is simpler and has no special timing requirements.
5) No random bit generator is needed. In the described structure, the implicit randomness of the input pair being equal or not perform the same function of random bit used in Grilo et al.
6) The described structure has no divided-by-two arithmetic operations involved, while these operations are necessary in the tree-structure as shown in FIG. 5 of Welz et al., and FIG. 6 of Galton.
7) The proposed implementation is much simpler than the tree-structure.

Figure 9:
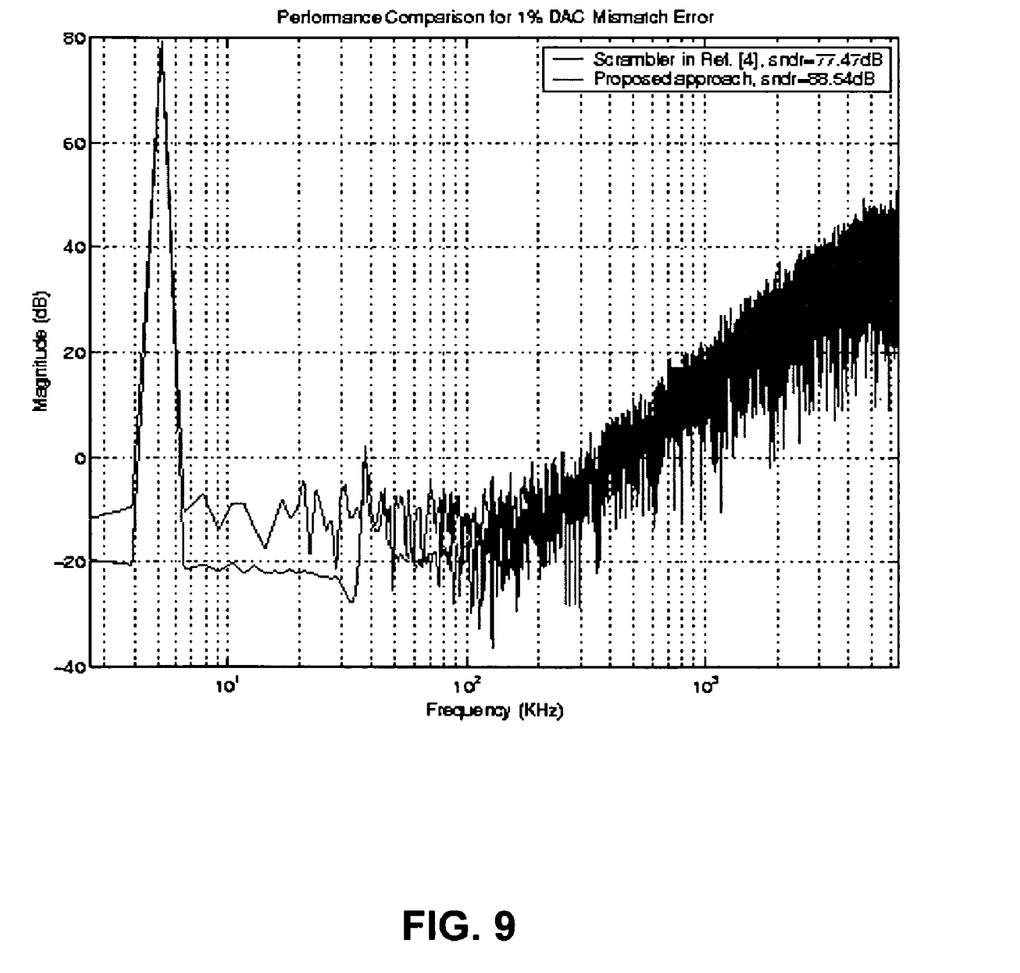
FIG. 9 shows performance comparison for 1% DAC mismatch error.

FIG. 9 shows the performance comparison between the proposed method and the scramble for 1% DAC mismatch error. The noise level is higher for the scramble, and the SNDR is 77.5 dB, while the proposed approach gives 88.5 dB.

3) There are seven and twelve switching blocks for the proposed method and the scrambler, respectively. Since each switching block requires one state-register, there are seven and twelve state registers required for the proposed approach and the scrambler, respectively. Therefore the proposed approach is more hardware-efficient.

Figure 10:
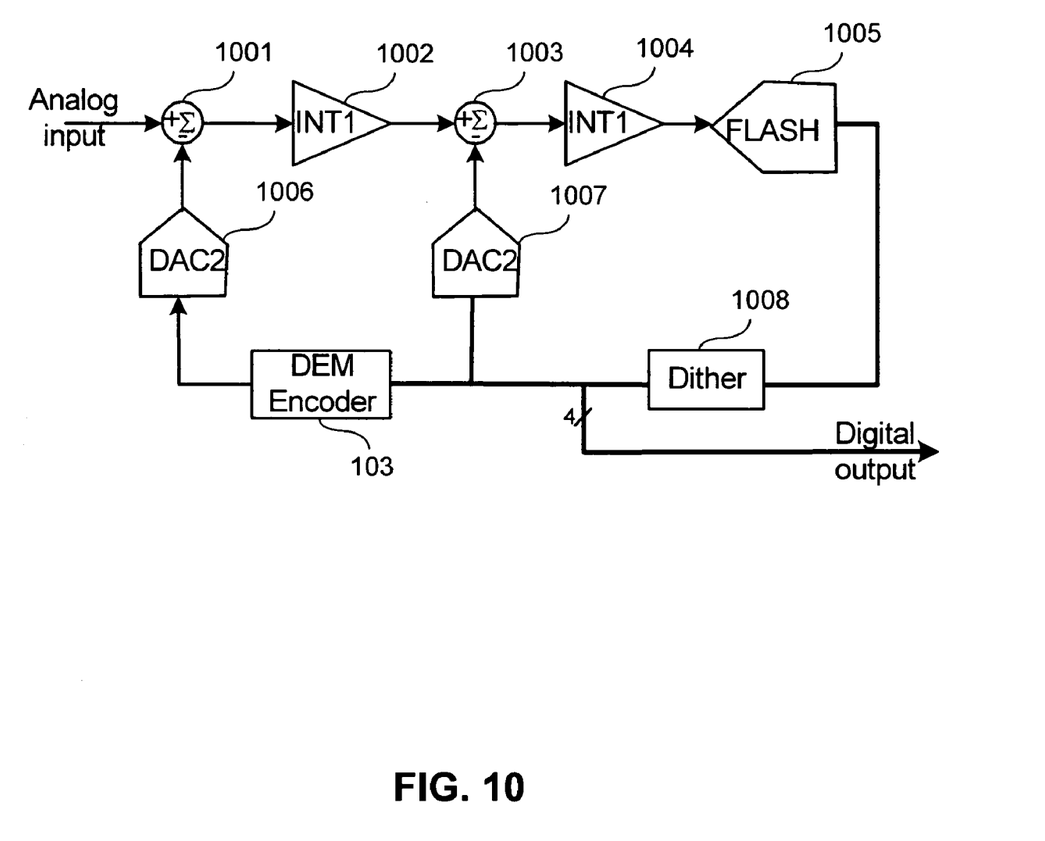
FIG. 10 shows the use of the present invention in an analog to digital converter.

FIG. 10 illustrates the use of the present invention in an analog to digital converter. As shown in FIG. 10, an analog input is fed into a summer 1001. It is then inputted into an integrator 1002 and then to a second summer 1003. The signal then is inputted into a second integrator 1004, and then into a flash converter 1005. From the flash converter 1005, the digital signal is fed into a dither circuit 1008, and is then inputted to a first 2-bit digital to analog converter 1007, the DEM encoder 103 as described previously, and is outputted in the form of four bits (in this example). From the DEM encoder 103, the signal is fed into a second 2-bit digital to analog converter 1006. The outputs of the digital to analog converter 1006 and 1007 are fed to the summers 1001 and 1003, respectively.

CONCLUSION

While various embodiments of the present invention have been described above, it should be understood that they have been presented by way of example, and not limitation. It will be apparent to persons skilled in the relevant art that various changes in form and detail can be made therein without departing from the spirit and scope of the invention.

The present invention has been described above with the aid of functional building blocks and method steps illustrating the performance of specified functions and relationships thereof. The boundaries of these functional building blocks and method steps have been arbitrarily defined herein for the convenience of the description. Alternate boundaries can be defined so long as the specified functions and relationships thereof are appropriately performed. Also, the order of method steps may be rearranged. Any such alternate boundaries are thus within the scope and spirit of the claimed invention. One skilled in the art will recognize that these functional building blocks can be implemented by discrete components, application specific integrated circuits, processors executing appropriate software and the like or any combination thereof. Thus, the breadth and scope of the present invention should not be limited by any of the above-described exemplary embodiments, but should be defined only in accordance with the following claims and their equivalents.

What is claimed is:

1. An apparatus for canceling a mismatch error, comprising:
   means for successively grouping bits of a k-bit input, thereby generating a vector at each successive grouping;
   first means for permuting an order of bits in the vector following each successive grouping; and
   means for outputting a k-bit output vector, the k-bit output vector resulting from a last grouping of two k/2-bit vectors;
   second means for permuting an order of a first 2N-bit vector and a second 2N-bit vector, wherein N is an integer; and
   wherein the first means for permuting permutes bits following each successive grouping based on a previous state thereof.

2. The apparatus of claim 1, wherein the previous state indicates whether data has been shuffled following a previous grouping.

3. The apparatus of claim 2, wherein the means for successively grouping bits further comprises:
   means for grouping a first bit and a second bit of the k-bit input to form a 2-bit vector; and
   means for grouping a first 2N-bit vector and a second 2N-bit vector to form a 4N-bit vector, wherein N is an integer.

4. The apparatus of claim 3, wherein the first means for permuting receives a first input and a second input and outputs a combination thereof.

5. The apparatus of claim 4, wherein the first input and the second input correspond to the first bit and the second bit, respectively.

6. The apparatus of claim 4, wherein the first input and the second input correspond to the first 2N-bit vector and the second 2N-bit vector, respectively.

7. The apparatus of claim 4, wherein the combination is a concatenation of the first input and the second input.

8. The apparatus of claim 7, wherein the first means for permuting comprises means for shuffling the first and second inputs, thereby having the second input precede the first input in the combination.

9. The apparatus of claim 8, wherein the first and second inputs are shuffled when the first and second inputs are not equal and when the first means for permuting did not shuffle the first and second inputs following the previous grouping.

10. The apparatus of claim 9, wherein the first means for permuting further comprises:
   means for comparing the first and second inputs; and
   means for determining the previous state thereof.

11. The apparatus of claim 10, wherein a current state of the first means for permuting is updated to indicate whether the first and second inputs have been shuffled.

12. The apparatus of claim 10, wherein the means for comparing further comprises:
   means for comparing a pair of bits; and
   means for bitwise comparing two bit vectors.

13. The apparatus of claim 10, wherein a mismatch error occurs in the first means for permuting when the first and second inputs are not equal.

14. The apparatus of claim 13, wherein the means for shuffling cancels the mismatch error following a subsequent grouping when the first input and the second input are equal to a subsequent first input and second input received by the first means for permuting, respectively.

15. The apparatus of claim 13, wherein the first input and the second input are 1 and 0, respectively.

16. The apparatus of claim 13, wherein the first input and the second input are bitwise different bit vectors.

17. The apparatus of claim 13, wherein the mismatch error results from analog output errors for "1" and "0" input in a digital to analog converter element.

18. The apparatus of claim 1, wherein the last grouping is the (k−1)-th grouping of bits of the k-bit input.

19. The apparatus of claim 1, wherein a number of bits with a value "1" in the k-bit output vector is equal to a number of bits with a value "1" in the k-bit input.

20. The apparatus of claim 1, wherein the k-bit input represents a balanced code.

* * * * *